United States Patent
Lu et al.

(10) Patent No.: US 9,209,074 B2
(45) Date of Patent: Dec. 8, 2015

(54) COBALT DEPOSITION ON BARRIER SURFACES

(71) Applicant: Applied Materials, Inc., Santa Clara, CA (US)

(72) Inventors: Jiang Lu, Milipitas, CA (US); Hyoung-Chan Ha, San Jose, CA (US); Paul F. Ma, Santa Clara, CA (US); Seshadri Ganguli, Sunnyvale, CA (US); Joseph F. Aubuchon, San Jose, CA (US); Sang-ho Yu, Cupertino, CA (US); Murali K. Narasimhan, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/717,375

(22) Filed: May 20, 2015

(65) Prior Publication Data
US 2015/0255333 A1    Sep. 10, 2015

Related U.S. Application Data (63) Continuation of application No. 12/201,976, filed on Aug. 29, 2008, now Pat. No. 9,051,641, which is a continuation-in-part of application No. 12/111,923, filed on Apr. 29, 2008, now abandoned, and a (Continued)

(51) Int. Cl.
*B05D 5/12* (2006.01)
*H01L 21/768* (2006.01)
*H01L 21/285* (2006.01)

(52) U.S. Cl.
CPC .... *H01L 21/76871* (2013.01); *H01L 21/28562* (2013.01); *H01L 21/28568* (2013.01); *H01L 21/76862* (2013.01); *H01L 21/76864* (2013.01); *H01L 21/76873* (2013.01)

(58) Field of Classification Search
USPC .................................................. 438/682–683
See application file for complete search history.

(56) References Cited

U.S. PATENT DOCUMENTS

| 4,058,430 A | 11/1977 | Suntola et al. |
| 4,389,973 A | 6/1983 | Suntola et al. |

(Continued)

FOREIGN PATENT DOCUMENTS

| CN | 1314225 | 9/2001 |
| CN | 101159253 A | 4/2008 |

(Continued)

OTHER PUBLICATIONS

Office Action for Chinese Application No. 200980134172.5 dated Aug. 8, 2013, 11 pages.

(Continued)

*Primary Examiner* — David Vu
*Assistant Examiner* — Jonathan Han
(74) *Attorney, Agent, or Firm* — Patterson & Sheridan, LLP (57) ABSTRACT

Embodiments of the invention provide processes for depositing a cobalt layer on a barrier layer and subsequently depositing a conductive material, such as copper or a copper alloy, thereon. In one embodiment, a method for depositing materials on a substrate surface is provided which includes forming a barrier layer on a substrate, exposing the substrate to dicobalt hexacarbonyl butylacetylene (CCTBA) and hydrogen to form a cobalt layer on the barrier layer during a vapor deposition process (e.g., CVD or ALD), and depositing a conductive material over the cobalt layer. In some examples, the barrier layer and/or the cobalt layer may be exposed to a gas or a reagent during a treatment process, such as a thermal process, an in situ plasma process, or a remote plasma process.

20 Claims, 2 Drawing Sheets

Related U.S. Application Data continuation-in-part of application No. 12/111,930, filed on Apr. 29, 2008, now abandoned, said application No. 12/111,923 is a continuation-in-part of application No. 11/733,929, filed on Apr. 11, 2007, now Pat. No. 8,110,489, said application No. 12/111,930 is a continuation-in-part of application No. 11/733,929, and a continuation-in-part of application No. 11/456,073, filed on Jul. 6, 2006, now Pat. No. 7,416,979, which is a continuation of application No. 10/845,970, filed on May 14, 2004, now abandoned, which is a continuation of application No. 10/044,412, filed on Jan. 9, 2002, now Pat. No. 6,740,585, which is a continuation-in-part of application No. 09/916,234, filed on Jul. 25, 2001, now abandoned.

(60) Provisional application No. 60/791,366, filed on Apr. 11, 2006, provisional application No. 60/863,939, filed on Nov. 1, 2006.

(56) References Cited

U.S. PATENT DOCUMENTS

| | | | |
|---|---|---|---|
| 4,413,022 | A | 11/1983 | Suntola et al. |
| 4,415,275 | A | 11/1983 | Dietrich |
| 4,486,487 | A | 12/1984 | Skarp |
| 4,500,409 | A | 2/1985 | Boys et al. |
| 4,761,269 | A | 8/1988 | Conger et al. |
| 4,814,294 | A | 3/1989 | West et al. |
| 4,824,544 | A | 4/1989 | Mikalesen et al. |
| 4,834,831 | A | 5/1989 | Nishizawa et al. |
| 4,951,601 | A | 8/1990 | Maydan et al. |
| 4,975,252 | A | 12/1990 | Nishizawa et al. |
| 4,993,357 | A | 2/1991 | Scholz |
| 5,027,746 | A | 7/1991 | Frijlink |
| 5,096,364 | A | 3/1992 | Messer et al. |
| 5,122,923 | A | 6/1992 | Matsubara et al. |
| 5,173,327 | A | 12/1992 | Sandhu et al. |
| 5,178,681 | A | 1/1993 | Moore et al. |
| 5,186,718 | A | 2/1993 | Tepman et al. |
| 5,225,366 | A | 7/1993 | Yoder |
| 5,242,566 | A | 9/1993 | Parker |
| 5,252,807 | A | 10/1993 | Chizinsky |
| 5,261,959 | A | 11/1993 | Gasworth |
| 5,281,274 | A | 1/1994 | Yoder |
| 5,286,296 | A | 2/1994 | Sato et al. |
| 5,294,286 | A | 3/1994 | Nishizawa et al. |
| 5,306,666 | A | 4/1994 | Izumi |
| 5,320,728 | A | 6/1994 | Tepman |
| 5,330,628 | A | 7/1994 | Demaray et al. |
| 5,335,138 | A | 8/1994 | Sandhu et al. |
| 5,338,362 | A | 8/1994 | Imahashi |
| 5,374,570 | A | 12/1994 | Nasu et al. |
| 5,441,703 | A | 8/1995 | Jurgensen |
| 5,443,647 | A | 8/1995 | Aucoin et al. |
| 5,480,818 | A | 1/1996 | Matsumoto et al. |
| 5,483,919 | A | 1/1996 | Yokoyama et al. |
| 5,503,875 | A | 4/1996 | Imai et al. |
| 5,519,373 | A | 5/1996 | Miyata |
| 5,526,244 | A | 6/1996 | Bishop |
| 5,527,438 | A | 6/1996 | Tepman |
| 5,544,771 | A | 8/1996 | Lee et al. |
| 5,589,039 | A | 12/1996 | Hsu |
| 5,593,551 | A | 1/1997 | Lai |
| 5,597,462 | A | 1/1997 | Cho |
| 5,616,218 | A | 4/1997 | Alex |
| 5,632,873 | A | 5/1997 | Steven et al. |
| 5,650,052 | A | 7/1997 | Edelstein et al. |
| 5,660,744 | A | 8/1997 | Sekine et al. |
| 5,666,247 | A | 9/1997 | Schultz |
| 5,674,786 | A | 10/1997 | Turner et al. |
| 5,711,811 | A | 1/1998 | Suntola et al. |
| 5,728,276 | A | 3/1998 | Katsuki et al. |
| 5,730,802 | A | 3/1998 | Ishizumi et al. |
| 5,736,021 | A | 4/1998 | Ding et al. |
| 5,744,016 | A | 4/1998 | Yamada et al. |
| 5,780,361 | A | 7/1998 | Inoue |
| 5,785,763 | A | 7/1998 | Onda et al. |
| 5,796,116 | A | 8/1998 | Nakata et al. |
| 5,804,488 | A | 9/1998 | Shih et al. |
| 5,807,792 | A | 9/1998 | Ilg et al. |
| 5,814,852 | A | 9/1998 | Sandhu et al. |
| 5,834,372 | A | 11/1998 | Lee |
| 5,835,677 | A | 11/1998 | Li et al. |
| 5,838,035 | A | 11/1998 | Ramesh |
| 5,851,896 | A | 12/1998 | Summerfelt |
| 5,855,680 | A | 1/1999 | Soininen et al. |
| 5,879,459 | A | 3/1999 | Gadgil et al. |
| 5,879,523 | A | 3/1999 | Wang et al. |
| 5,886,864 | A | 3/1999 | Dvorsky |
| 5,899,720 | A | 5/1999 | Mikagi |
| 5,902,129 | A | 5/1999 | Yoshikawa et al. |
| 5,913,145 | A | 6/1999 | Lu et al. |
| 5,916,365 | A | 6/1999 | Sherman |
| 5,923,056 | A | 7/1999 | Lee et al. |
| 5,936,831 | A | 8/1999 | Kola et al. |
| 5,945,008 | A | 8/1999 | Kisakibaru et al. |
| 5,954,929 | A | 9/1999 | Uchiyama et al. |
| 5,972,430 | A | 10/1999 | DiMeo, Jr. et al. |
| 6,007,403 | A | 12/1999 | Urspringer et al. |
| 6,008,124 | A | 12/1999 | Sekiguchi et al. |
| 6,014,943 | A | 1/2000 | Arami et al. |
| 6,015,590 | A | 1/2000 | Suntola et al. |
| 6,015,917 | A | 1/2000 | Bhandari et al. |
| 6,033,537 | A | 3/2000 | Suguro |
| 6,042,652 | A | 3/2000 | Hyun et al. |
| 6,071,055 | A | 6/2000 | Tepman |
| 6,071,572 | A | 6/2000 | Mosely et al. |
| 6,084,302 | A | 7/2000 | Sandhu |
| 6,099,904 | A | 8/2000 | Mak et al. |
| 6,124,158 | A | 9/2000 | Dautartas et al. |
| 6,132,575 | A | 10/2000 | Pandumsopom et al. |
| 6,139,700 | A | 10/2000 | Kang et al. |
| 6,144,060 | A | 11/2000 | Park et al. |
| 6,156,170 | A | 12/2000 | Akari et al. |
| 6,156,382 | A | 12/2000 | Rajagopalan et al. |
| 6,165,807 | A | 12/2000 | Lee et al. |
| 6,171,922 | B1 | 1/2001 | Maghsoudnia |
| 6,174,377 | B1 | 1/2001 | Doering et al. |
| 6,174,809 | B1 | 1/2001 | Kang et al. |
| 6,179,983 | B1 | 1/2001 | Reid et al. |
| 6,183,563 | B1 | 2/2001 | Choi et al. |
| 6,190,495 | B1 | 2/2001 | Kubota et al. |
| 6,197,683 | B1 | 3/2001 | Kang et al. |
| 6,200,893 | B1 | 3/2001 | Sneh |
| 6,203,613 | B1 | 3/2001 | Gates et al. |
| 6,207,302 | B1 | 3/2001 | Sugiura et al. |
| 6,207,487 | B1 | 3/2001 | Kim et al. |
| 6,214,731 | B1 | 4/2001 | Nogami et al. |
| 6,218,298 | B1 | 4/2001 | Hoinkis |
| 6,218,716 | B1 | 4/2001 | Wang et al. |
| 6,221,766 | B1 | 4/2001 | Wasserman |
| 6,224,312 | B1 | 5/2001 | Sundar |
| 6,225,176 | B1 | 5/2001 | Yu |
| 6,231,672 | B1 | 5/2001 | Choi et al. |
| 6,235,634 | B1 | 5/2001 | White et al. |
| 6,238,533 | B1 | 5/2001 | Satitpunwaycha et al. |
| 6,251,759 | B1 | 6/2001 | Guo et al. |
| 6,270,572 | B1 | 8/2001 | Kim et al. |
| 6,274,484 | B1 | 8/2001 | Tsai et al. |
| 6,284,646 | B1 | 9/2001 | Leem |
| 6,287,965 | B1 | 9/2001 | Kang et al. |
| 6,294,836 | B1 | 9/2001 | Paranjpe et al. |
| 6,302,965 | B1 | 10/2001 | Umotoy et al. |
| 6,305,314 | B1 | 10/2001 | Sneh et al. |
| 6,306,216 | B1 | 10/2001 | Kim et al. |
| 6,326,297 | B1 | 12/2001 | Vijayendran |
| 6,326,306 | B1 | 12/2001 | Lin |
| 6,333,260 | B1 | 12/2001 | Kwon et al. |
| 6,335,280 | B1 | 1/2002 | van der Jeugd |
| 6,342,277 | B1 | 1/2002 | Sherman |
| 6,346,477 | B1 | 2/2002 | Kaloyeros et al. |
| 6,348,376 | B2 | 2/2002 | Lim et al. |

(56) References Cited

U.S. PATENT DOCUMENTS

| | | |
|---|---|---|
| 6,355,561 B1 | 3/2002 | Sandhu et al. |
| 6,358,829 B2 | 3/2002 | Yoon et al. |
| 6,365,502 B1 | 4/2002 | Paranjpe et al. |
| 6,368,954 B1 | 4/2002 | Lopatin et al. |
| 6,369,430 B1 | 4/2002 | Adetutu et al. |
| 6,372,598 B2 | 4/2002 | Kang et al. |
| 6,379,748 B1 | 4/2002 | Bhandari et al. |
| 6,391,785 B1 | 5/2002 | Satta et al. |
| 6,399,491 B2 | 6/2002 | Jeon et al. |
| 6,416,577 B1 | 7/2002 | Suntoloa et al. |
| 6,416,822 B1 | 7/2002 | Chiang et al. |
| 6,420,189 B1 | 7/2002 | Lopatin |
| 6,423,619 B1 | 7/2002 | Grant et al. |
| 6,428,859 B1 | 8/2002 | Chiang et al. |
| 6,444,263 B1 | 9/2002 | Paranjpe et al. |
| 6,447,607 B2 | 9/2002 | Soininen et al. |
| 6,447,933 B1 | 9/2002 | Wang et al. |
| 6,451,119 B2 | 9/2002 | Sneh et al. |
| 6,451,695 B2 | 9/2002 | Sneh |
| 6,454,860 B2 | 9/2002 | Metzner et al. |
| 6,458,701 B1 | 10/2002 | Chae et al. |
| 6,468,924 B2 | 10/2002 | Lee et al. |
| 6,475,276 B1 | 11/2002 | Elers et al. |
| 6,475,854 B2 | 11/2002 | Narwankar et al. |
| 6,475,910 B1 | 11/2002 | Sneh |
| 6,478,872 B1 | 11/2002 | Chae et al. |
| 6,481,945 B1 | 11/2002 | Hasper et al. |
| 6,482,262 B1 | 11/2002 | Elers et al. |
| 6,482,733 B2 | 11/2002 | Raajmakers et al. |
| 6,482,740 B2 | 11/2002 | Soininen et al. |
| 6,495,854 B1 | 12/2002 | Newns et al. |
| 6,511,539 B1 | 1/2003 | Raaijmakers |
| 6,524,952 B1 | 2/2003 | Srinivas et al. |
| 6,527,855 B2 | 3/2003 | De la Rosa et al. |
| 6,534,395 B2 | 3/2003 | Werkhoven et al. |
| 6,534,404 B1 | 3/2003 | Danek et al. |
| 6,548,112 B1 | 4/2003 | Hillman et al. |
| 6,548,424 B2 | 4/2003 | Putkonen |
| 6,551,406 B2 | 4/2003 | Kilpi |
| 6,551,929 B1 | 4/2003 | Kori et al. |
| 6,569,501 B2 | 5/2003 | Chiang et al. |
| 6,572,705 B1 | 6/2003 | Suntola et al. |
| 6,578,287 B2 | 6/2003 | Aswad |
| 6,579,372 B2 | 6/2003 | Park |
| 6,585,823 B1 | 7/2003 | Van Wijck |
| 6,592,728 B1 | 7/2003 | Paranjpe et al. |
| 6,593,484 B2 | 7/2003 | Yasuhara et al. |
| 6,596,602 B2 | 7/2003 | Iizuka et al. |
| 6,599,572 B2 | 7/2003 | Saanila et al. |
| 6,607,976 B2 | 8/2003 | Chen et al. |
| 6,620,723 B1 | 9/2003 | Byun et al. |
| 6,627,995 B2 | 9/2003 | Paranjpe et al. |
| 6,630,030 B1 | 10/2003 | Suntola et al. |
| 6,630,201 B2 | 10/2003 | Chiang et al. |
| 6,632,279 B1 | 10/2003 | Ritala et al. |
| 6,635,965 B1 | 10/2003 | Lee et al. |
| 6,645,847 B2 | 11/2003 | Paranjpe et al. |
| 6,660,126 B2 | 12/2003 | Nguyen et al. |
| 6,686,271 B2 | 2/2004 | Raajmakers et al. |
| 6,692,617 B1 | 2/2004 | Fu et al. |
| 6,716,287 B1 | 4/2004 | Santiago et al. |
| 6,718,126 B2 | 4/2004 | Lei |
| 6,730,197 B2 | 5/2004 | Wang et al. |
| 6,734,020 B2 | 5/2004 | Lu et al. |
| 6,740,585 B2 | 5/2004 | Yoon et al. |
| 6,743,340 B2 | 6/2004 | Fu |
| 6,772,072 B2 | 8/2004 | Ganguli et al. |
| 6,773,507 B2 | 8/2004 | Jallepally et al. |
| 6,777,352 B2 | 8/2004 | Tepman et al. |
| 6,778,762 B1 | 8/2004 | Shareef et al. |
| 6,784,096 B2 | 8/2004 | Chen et al. |
| 6,790,773 B1 | 9/2004 | Drewery et al. |
| 6,803,272 B1 | 10/2004 | Halliyal et al. |
| 6,812,126 B1 | 11/2004 | Velo et al. |
| 6,815,285 B2 | 11/2004 | Choi et al. |
| 6,818,094 B2 | 11/2004 | Yudovsky |
| 6,821,563 B2 | 11/2004 | Yudovsky |
| 6,838,125 B2 | 1/2005 | Chung et al. |
| 6,861,356 B2 | 3/2005 | Matsuse et al. |
| 6,866,746 B2 | 3/2005 | Lei et al. |
| 6,868,859 B2 | 3/2005 | Yudovski |
| 6,881,437 B2 | 4/2005 | Ivanov et al. |
| 6,893,915 B2 | 5/2005 | Park et al. |
| 6,902,624 B2 | 6/2005 | Seidel et al. |
| 6,921,062 B2 | 7/2005 | Gregg et al. |
| 6,936,538 B2 | 8/2005 | Byun |
| 6,958,174 B1 | 10/2005 | Klaus et al. |
| 6,960,284 B2 | 11/2005 | Fu et al. |
| 7,005,697 B2 | 2/2006 | Batra et al. |
| 7,172,967 B2 | 2/2007 | Kim et al. |
| 7,211,506 B2 | 5/2007 | Moon et al |
| 7,264,846 B2 | 9/2007 | Chang et al. |
| 7,265,048 B2 | 9/2007 | Chung et al. |
| 2001/0000866 A1 | 5/2001 | Sneh et al. |
| 2001/0002280 A1 | 5/2001 | Sneh |
| 2001/0003063 A1 | 6/2001 | Hu et al. |
| 2001/0009140 A1 | 7/2001 | Bondestam et al. |
| 2001/0009695 A1 | 7/2001 | Saanila et al. |
| 2001/0011526 A1 | 8/2001 | Doering et al. |
| 2001/0013312 A1 | 8/2001 | Soininen et al. |
| 2001/0014371 A1 | 8/2001 | Kilpi |
| 2001/0024387 A1 | 9/2001 | Raaijmakers et al. |
| 2001/0025979 A1 | 10/2001 | Kim et al. |
| 2001/0028924 A1 | 10/2001 | Sherman |
| 2001/0029094 A1 | 10/2001 | Mee-Young et al. |
| 2001/0034123 A1 | 10/2001 | Jeon et al. |
| 2001/0041250 A1 | 11/2001 | Werkhoven |
| 2001/0042523 A1 | 11/2001 | Kasala |
| 2001/0042799 A1 | 11/2001 | Kim et al. |
| 2001/0043453 A1 | 11/2001 | Narwankar |
| 2001/0050039 A1 | 12/2001 | Park |
| 2001/0054377 A1 | 12/2001 | Lindfors et al. |
| 2001/0054730 A1 | 12/2001 | Kim et al. |
| 2001/0054769 A1 | 12/2001 | Raaijmakers et al. |
| 2002/0000196 A1 | 1/2002 | Park |
| 2002/0000598 A1 | 1/2002 | Kang et al. |
| 2002/0004293 A1 | 1/2002 | Soininen et al. |
| 2002/0007790 A1 | 1/2002 | Park |
| 2002/0009544 A1 | 1/2002 | McFeely et al. |
| 2002/0009896 A1 | 1/2002 | Sandhu et al. |
| 2002/0017242 A1 | 2/2002 | Hamaguchi et al. |
| 2002/0019121 A1 | 2/2002 | Pyo |
| 2002/0020869 A1 | 2/2002 | Park et al. |
| 2002/0021544 A1 | 2/2002 | Cho et al. |
| 2002/0031618 A1 | 3/2002 | Sherman |
| 2002/0037630 A1 | 3/2002 | Agarwal et al. |
| 2002/0041931 A1 | 4/2002 | Suntola et al. |
| 2002/0048635 A1 | 4/2002 | Kim et al. |
| 2002/0048880 A1 | 4/2002 | Lee |
| 2002/0052097 A1 | 5/2002 | Park |
| 2002/0055235 A1 | 5/2002 | Agarwal et al. |
| 2002/0060363 A1 | 5/2002 | Xi et al. |
| 2002/0061612 A1 | 5/2002 | Sandhu et al. |
| 2002/0066411 A1 | 6/2002 | Chiang et al. |
| 2002/0068458 A1 | 6/2002 | Chiang et al. |
| 2002/0073924 A1 | 6/2002 | Chiang et al. |
| 2002/0074588 A1 | 6/2002 | Lee et al. |
| 2002/0076481 A1 | 6/2002 | Chiang et al. |
| 2002/0076507 A1 | 6/2002 | Chiang et al. |
| 2002/0076508 A1 | 6/2002 | Chiang et al. |
| 2002/0076837 A1 | 6/2002 | Hujanen et al. |
| 2002/0081381 A1 | 6/2002 | De la Rosa et al. |
| 2002/0081844 A1 | 6/2002 | Jeon et al. |
| 2002/0086106 A1 | 7/2002 | Park et al. |
| 2002/0086111 A1 | 7/2002 | Byun et al. |
| 2002/0086507 A1 | 7/2002 | Park et al. |
| 2002/0090829 A1 | 7/2002 | Sandhu et al. |
| 2002/0092471 A1 | 7/2002 | Kang et al. |
| 2002/0094689 A1 | 7/2002 | Park |
| 2002/0098627 A1 | 7/2002 | Pomarede et al. |
| 2002/0104481 A1 | 8/2002 | Chiang et al. |
| 2002/0105088 A1 | 8/2002 | Yang et al. |
| 2002/0106536 A1 | 8/2002 | Lee et al. |
| 2002/0106846 A1 | 8/2002 | Seutter et al. |

(56) References Cited

U.S. PATENT DOCUMENTS

| | | |
|---|---|---|
| 2002/0108570 A1 | 8/2002 | Lindfors |
| 2002/0109168 A1 | 8/2002 | Kim et al. |
| 2002/0110991 A1 | 8/2002 | Li |
| 2002/0115886 A1 | 8/2002 | Yasuhara et al. |
| 2002/0117399 A1 | 8/2002 | Chen et al. |
| 2002/0121241 A1 | 9/2002 | Nguyen et al. |
| 2002/0121342 A1 | 9/2002 | Nguyen et al. |
| 2002/0121697 A1 | 9/2002 | Marsh |
| 2002/0127745 A1 | 9/2002 | Lu et al. |
| 2002/0134307 A1 | 9/2002 | Choi |
| 2002/0135071 A1 | 9/2002 | Kang et al. |
| 2002/0144655 A1 | 10/2002 | Chiang et al. |
| 2002/0144657 A1 | 10/2002 | Chiang et al. |
| 2002/0146511 A1 | 10/2002 | Chiang et al. |
| 2002/0155722 A1 | 10/2002 | Satta et al. |
| 2002/0162506 A1 | 11/2002 | Sneh et al. |
| 2002/0164421 A1 | 11/2002 | Chiang et al. |
| 2002/0164423 A1 | 11/2002 | Chiang et al. |
| 2002/0177282 A1 | 11/2002 | Song et al. |
| 2002/0182320 A1 | 12/2002 | Leskela et al. |
| 2002/0187256 A1 | 12/2002 | Elers et al. |
| 2002/0187631 A1 | 12/2002 | Kim et al. |
| 2002/0197402 A1 | 12/2002 | Chiang et al. |
| 2002/0197856 A1 | 12/2002 | Matsuse et al. |
| 2002/0197863 A1 | 12/2002 | Mak et al. |
| 2003/0004723 A1 | 1/2003 | Chihara |
| 2003/0010451 A1 | 1/2003 | Tzu et al. |
| 2003/0013300 A1 | 1/2003 | Byun |
| 2003/0013320 A1 | 1/2003 | Kim et al. |
| 2003/0015421 A1 | 1/2003 | Chan et al. |
| 2003/0017697 A1 | 1/2003 | Choi et al. |
| 2003/0019745 A1 | 1/2003 | Wang et al. |
| 2003/0022338 A1 | 1/2003 | Ruben et al. |
| 2003/0022487 A1 | 1/2003 | Yoon et al. |
| 2003/0029715 A1 | 2/2003 | Yu et al. |
| 2003/0031807 A1 | 2/2003 | Elers et al. |
| 2003/0032281 A1 | 2/2003 | Werkhoven et al. |
| 2003/0038369 A1 | 2/2003 | Layadi et al. |
| 2003/0042630 A1 | 3/2003 | Babcoke et al. |
| 2003/0049931 A1 | 3/2003 | Byun et al. |
| 2003/0049942 A1 | 3/2003 | Haukka et al. |
| 2003/0053799 A1 | 3/2003 | Lei |
| 2003/0054631 A1 | 3/2003 | Raaijmakers et al. |
| 2003/0057526 A1 | 3/2003 | Chung et al. |
| 2003/0057527 A1 | 3/2003 | Chung et al. |
| 2003/0059538 A1 | 3/2003 | Chung et al. |
| 2003/0072884 A1 | 4/2003 | Zhang et al. |
| 2003/0072913 A1 | 4/2003 | Chou et al. |
| 2003/0072975 A1 | 4/2003 | Shero et al. |
| 2003/0075273 A1 | 4/2003 | Kilpela et al. |
| 2003/0075925 A1 | 4/2003 | Lindfors et al. |
| 2003/0079686 A1 | 5/2003 | Chen et al. |
| 2003/0082296 A1 | 5/2003 | Elers et al. |
| 2003/0082300 A1 | 5/2003 | Todd et al. |
| 2003/0082301 A1 | 5/2003 | Chen et al. |
| 2003/0082307 A1 | 5/2003 | Chung et al. |
| 2003/0089308 A1 | 5/2003 | Raaijmakers |
| 2003/0101927 A1 | 6/2003 | Raaijmakers et al. |
| 2003/0101938 A1 | 6/2003 | Ronsse et al. |
| 2003/0104126 A1 | 6/2003 | Fang et al. |
| 2003/0106490 A1 | 6/2003 | Jallepally et al. |
| 2003/0108674 A1 | 6/2003 | Chung et al. |
| 2003/0113187 A1 | 6/2003 | Lei et al. |
| 2003/0116087 A1 | 6/2003 | Nguyen et al. |
| 2003/0121469 A1 | 7/2003 | Lindfors et al. |
| 2003/0121608 A1 | 7/2003 | Chen et al. |
| 2003/0123216 A1 | 7/2003 | Yoon et al. |
| 2003/0124262 A1 | 7/2003 | Chen et al. |
| 2003/0129826 A1 | 7/2003 | Werkhoven et al. |
| 2003/0134508 A1 | 7/2003 | Raaijmakers et al. |
| 2003/0140854 A1 | 7/2003 | Kilpi |
| 2003/0143328 A1 | 7/2003 | Chen et al. |
| 2003/0143747 A1 | 7/2003 | Bondestam et al. |
| 2003/0143839 A1 | 7/2003 | Raaijmakers et al. |
| 2003/0143841 A1 | 7/2003 | Yang et al. |
| 2003/0146084 A1 | 8/2003 | Fu |
| 2003/0153177 A1 | 8/2003 | Tepman et al. |
| 2003/0153181 A1 | 8/2003 | Yoon et al. |
| 2003/0161952 A1 | 8/2003 | Wang et al. |
| 2003/0165615 A1 | 9/2003 | Aaltonen et al. |
| 2003/0168750 A1 | 9/2003 | Basceri et al. |
| 2003/0172872 A1 | 9/2003 | Thakur et al. |
| 2003/0173586 A1 | 9/2003 | Moriwaki et al. |
| 2003/0186495 A1 | 10/2003 | Saanila et al. |
| 2003/0190423 A1 | 10/2003 | Yang et al. |
| 2003/0190497 A1 | 10/2003 | Yang et al. |
| 2003/0190804 A1 | 10/2003 | Glenn et al. |
| 2003/0194493 A1 | 10/2003 | Chang et al. |
| 2003/0194825 A1 | 10/2003 | Law et al. |
| 2003/0198754 A1 | 10/2003 | Xi et al. |
| 2003/0201538 A1 | 10/2003 | Lee et al. |
| 2003/0203616 A1 | 10/2003 | Chung et al. |
| 2003/0205729 A1 | 11/2003 | Basceri et al. |
| 2003/0213560 A1 | 11/2003 | Wang et al. |
| 2003/0213987 A1 | 11/2003 | Basceri et al. |
| 2003/0216981 A1 | 11/2003 | Tillman |
| 2003/0219942 A1 | 11/2003 | Choi et al. |
| 2003/0221780 A1 | 12/2003 | Lei et al. |
| 2003/0224107 A1 | 12/2003 | Lindfors et al. |
| 2003/0224217 A1 | 12/2003 | Byun et al. |
| 2003/0224578 A1 | 12/2003 | Chung et al. |
| 2003/0224600 A1 | 12/2003 | Cao et al. |
| 2003/0228745 A1 | 12/2003 | Lur et al. |
| 2003/0232497 A1 | 12/2003 | Xi et al. |
| 2003/0235961 A1 | 12/2003 | Metzner et al. |
| 2004/0005749 A1 | 1/2004 | Choi et al. |
| 2004/0009307 A1 | 1/2004 | Koh et al. |
| 2004/0011404 A1 | 1/2004 | Ku et al. |
| 2004/0011504 A1 | 1/2004 | Ku et al. |
| 2004/0013577 A1 | 1/2004 | Ganguli et al. |
| 2004/0013803 A1 | 1/2004 | Chung et al. |
| 2004/0014315 A1 | 1/2004 | Lai et al. |
| 2004/0014320 A1 | 1/2004 | Chen et al. |
| 2004/0015300 A1 | 1/2004 | Ganguli et al. |
| 2004/0016404 A1 | 1/2004 | Gregg et al. |
| 2004/0018304 A1 | 1/2004 | Chung et al. |
| 2004/0018723 A1 | 1/2004 | Byun et al. |
| 2004/0018747 A1 | 1/2004 | Lee et al. |
| 2004/0021164 A1 | 2/2004 | Kim et al. |
| 2004/0025370 A1 | 2/2004 | Guenther |
| 2004/0033698 A1 | 2/2004 | Lee et al. |
| 2004/0041320 A1 | 3/2004 | Hodumi |
| 2004/0043630 A1 | 3/2004 | Vaartstra et al. |
| 2004/0046197 A1 | 3/2004 | Basceri et al. |
| 2004/0065255 A1 | 4/2004 | Yang et al. |
| 2004/0069227 A1 | 4/2004 | Ku et al. |
| 2004/0071897 A1 | 4/2004 | Verplancken et al. |
| 2004/0077158 A1 | 4/2004 | Um et al. |
| 2004/0077183 A1 | 4/2004 | Chung et al. |
| 2004/0105934 A1 | 6/2004 | Chang et al. |
| 2004/0140205 A1 | 7/2004 | Fu et al. |
| 2004/0144308 A1 | 7/2004 | Yudovsky |
| 2004/0144311 A1 | 7/2004 | Chen et al. |
| 2004/0187304 A1 | 9/2004 | Chen et al. |
| 2004/0203233 A1 | 10/2004 | Kang et al. |
| 2004/0203254 A1 | 10/2004 | Conley, Jr. et al. |
| 2004/0207093 A1 | 10/2004 | Sun et al. |
| 2004/0211665 A1 | 10/2004 | Yoon et al. |
| 2004/0216998 A1 | 11/2004 | Fu |
| 2004/0219784 A1 | 11/2004 | Kang et al. |
| 2004/0224506 A1 | 11/2004 | Choi et al. |
| 2004/0235285 A1 | 11/2004 | Kang et al. |
| 2004/0241321 A1 | 12/2004 | Ganguli et al. |
| 2004/0253375 A1 | 12/2004 | Ivanov et al. |
| 2004/0256351 A1 | 12/2004 | Chung et al. |
| 2005/0006799 A1 | 1/2005 | Gregg et al. |
| 2005/0009325 A1 | 1/2005 | Chung et al. |
| 2005/0059240 A1 | 3/2005 | Choi et al. |
| 2005/0064207 A1 | 3/2005 | Senzaki et al. |
| 2005/0064706 A1 | 3/2005 | Kim et al. |
| 2005/0070126 A1 | 3/2005 | Senzaki |
| 2005/0085031 A1 | 4/2005 | Lopatin et al. |
| 2005/0095859 A1 | 5/2005 | Chen et al. |
| 2005/0104142 A1 | 5/2005 | Narayanan et al. |

(56) References Cited

U.S. PATENT DOCUMENTS

| | | |
|---|---|---|
| 2005/0136659 A1 | 6/2005 | Yun et al. |
| 2005/0153571 A1 | 7/2005 | Senzaki |
| 2005/0196960 A1 | 9/2005 | Koo et al. |
| 2005/0220998 A1 | 10/2005 | Chang et al. |
| 2005/0233156 A1 | 10/2005 | Senzaki et al. |
| 2005/0255243 A1 | 11/2005 | Senzaki |
| 2006/0033678 A1 | 2/2006 | Lubomirsky et al. |
| 2006/0153973 A1 | 7/2006 | Chang et al. |
| 2006/0199372 A1 | 9/2006 | Chung et al. |
| 2006/0276020 A1 | 12/2006 | Yoon et al. |
| 2007/0119370 A1 | 5/2007 | Ma et al. |
| 2007/0119371 A1 | 5/2007 | Ma et al. |
| 2007/0128862 A1 | 6/2007 | Ma et al. |
| 2007/0128863 A1 | 6/2007 | Ma et al. |
| 2007/0128864 A1 | 6/2007 | Ma et al. |
| 2007/0202254 A1 | 8/2007 | Ganguli et al. |
| 2008/0135914 A1 | 6/2008 | Krishna et al. |
| 2008/0268635 A1 | 10/2008 | Yu et al. |
| 2009/0004850 A1 | 1/2009 | Ganguli et al. |

FOREIGN PATENT DOCUMENTS

| | | |
|---|---|---|
| EP | 0 497 267 | 1/1992 |
| EP | 0 703 598 | 3/1996 |
| EP | 0 799 903 | 10/1997 |
| EP | 1 091 016 | 4/2001 |
| EP | 1 146 548 | 10/2001 |
| EP | 1 167 569 | 1/2002 |
| GB | 2 355 727 | 5/2001 |
| JP | 58-098917 | 6/1983 |
| JP | 61-174725 | 8/1986 |
| JP | 64-28921 | 1/1989 |
| JP | 02-246161 | 9/1990 |
| JP | 2-298263 | 12/1990 |
| JP | 3-140487 | 6/1991 |
| JP | 3-240944 | 10/1991 |
| JP | 04-291916 | 9/1992 |
| JP | 5-195213 | 8/1993 |
| JP | 05-206036 | 8/1993 |
| JP | 05-234899 | 9/1993 |
| JP | 05-270997 | 10/1993 |
| JP | 5-311419 | 11/1993 |
| JP | 06-224138 | 5/1994 |
| JP | 7-126844 | 5/1995 |
| JP | 07-300649 | 11/1995 |
| JP | 05-047666 | 2/1996 |
| JP | 08-060355 | 3/1996 |
| JP | 10-308283 | 11/1998 |
| JP | 11-195620 | 7/1999 |
| JP | 2000-031387 | 1/2000 |
| JP | 2000-058777 | 2/2000 |
| JP | 2000-319772 | 3/2000 |
| JP | 2000-178735 | 6/2000 |
| JP | 2001-020075 | 11/2000 |
| JP | 2001-95821 | 4/2001 |
| JP | 2001-111000 | 4/2001 |
| JP | 2001-144094 A | 5/2001 |
| JP | 2001144094 A | 5/2001 |
| JP | 2001-172767 | 6/2001 |
| JP | 2001-220294 | 8/2001 |
| JP | 2001-254181 | 9/2001 |
| JP | 2000-212752 | 11/2002 |
| JP | 2007-123853 A | 5/2007 |
| JP | 2007123853 A | 5/2007 |
| TW | 200746268 | 12/2007 |
| WO | 96/17107 | 6/1996 |
| WO | 98/51838 | 11/1998 |
| WO | 99/01595 | 1/1999 |
| WO | 99/29924 | 6/1999 |
| WO | 99/65064 | 12/1999 |
| WO | 00/15865 | 3/2000 |
| WO | 00/16377 | 3/2000 |
| WO | 00/30156 | 5/2000 |
| WO | 00/54320 | 9/2000 |
| WO | 00/63957 | 10/2000 |
| WO | 00/79576 | 12/2000 |
| WO | 01/15220 | 3/2001 |
| WO | 01/17692 | 3/2001 |
| WO | 01/27346 | 4/2001 |
| WO | 01/27347 | 4/2001 |
| WO | 01/29280 | 4/2001 |
| WO | 01/29891 | 4/2001 |
| WO | 01/29893 | 4/2001 |
| WO | 01/36702 | 5/2001 |
| WO | 01/66832 | 9/2001 |
| WO | 02/01628 | 1/2002 |
| WO | 02/08485 | 1/2002 |
| WO | 02/08488 | 1/2002 |
| WO | 02/43115 | 5/2002 |
| WO | 02/45167 | 6/2002 |
| WO | 02/45871 | 6/2002 |
| WO | 02/46489 | 6/2002 |
| WO | 02/67319 | 6/2002 |
| WO | 03/023835 | 3/2003 |
| WO | 2004/008491 | 1/2004 |
| WO | 2007121249 A2 | 10/2007 |

OTHER PUBLICATIONS

Office Action for Chinese Application No. 200980134172.5 dated Apr. 15, 2014, 12 pages.
Office Action dated Dec. 3, 2013 for Japanese Patent Application No. 2011-525098.
Notice of First Office Action dated Dec. 5, 2013 for Chinese Patent Application No. 200980134172.5.
Notice of First Office Action dated Jan. 3, 2011 for Korean Patent Application No. 10-2008-7027610.
Notice of First Office Action dated May 10, 2010 for Chinese Patent Application No. 200780021549.7.
PCT International Search Report and Written Opinion dated Mar. 23, 2010 for International Application No. PCT/US2009/054307.
Booyong S. Lim et al, "Atomic Layer Deposition of Transition Metals." Nature Materials, Nov. 2003, vol. 2, pp. 749-754.
Asamaki et al. "Copper Self-Sputtering by Planar Magnetron," Japanese Journal of Applied Physics, vol. 33, (1994), Part 1, No. 5A, May 1994, pp. 2500-2503.
Asamaki et al. "Filing of Sub-I.Jm Though-holes by Self-sputer Depositon" Japanese Journal of Applied Physics, vol. 33, (1994), Part 1, No. 8, Aug. 1999, pp. 4566-4569.
Byun, et al. "Effect of Deposition Temperature and Sputtering Ambient on in Situ Cobait Silicide Formation," J. Electrochem. Soc., vol. 144, No. 9, (Sep. 1997), pp. 3175-3179.
Cameron, et al. "Atomic Layer Deposition of Si02 and Ti02 in Alumina Tubular Membranes: Pore Reduction and Effect of Surface Species on Gas Transport," Langmuir, vol. 16, No. 19, American Chemical Society, 2000, pp. 7435-7444.
Clark-Phelps, et al. "Engineered Tantalum Aluminate and Hafnium Aluminate ALD Films for Ultrathin Dieiectric Films with Improved Electrical and Thermal Properties," Mat. Res. Soc. Symp. Proc. vol. 670, (2001), pp. K2.2.1-K2,2.6.
Dormans, et al. "OMCVD of cobalt and cobalt silicide," Journal of Crystal Growth 114, (1991 ), Elsevier Publishers B.V., pp. 364-372.
Eisenbraun, et al. "Atomic Layer Deposition (ALD) of Tantalum-based materials for zero thickness copper barrier applications," Proceedings of the IEEE 2001 International Interconnect Technology Conference (Cat. No. 01 EX461 ), 2001.
Elam, et al. "Nucleation and Growth During Tungsten Atomic Layer Deposition on Si02 Surfaces," Thin Solid Films, 386, (2001), pp. 41-52.
Froment, et al. "Nickel vs. Cobalt silicide integration for sub-50-nm CMOS," European Solid-State Device Research, 2003, ESSDERC '03. 33rdconference on Sep. 16-18, 2003, pp. 215-218.
George, et al, "Surface Chemistry for Atomic Layer Growth," J. Phys. Chern. 1996, 100, pp. 13121-13131.
Goswami, et al. Transition Metals Show Promise as Copper Barriers, Semiconductor International, ATMI, San Jose—May 1, 2004, Semiconductor International, pp. 1-7.

(56) References Cited

OTHER PUBLICATIONS

Hong, et al. "Characteristics of PAALD-TaN thin films derived from TAIMATA precursor for copper metallization," Interconnect Technology Conference, 2004, Proceedings of the IEEE 2004 International, Jun. 7-9, 2004, pp. 9-11.
Hwang, et al. "Nanometer-Size a-Pb02-type Ti02 in Garnet: A Thermobarometer for Ultrahigh-Pressure Metamorphism," Science Vol, 288, (Apr. 14, 2000), pp. 321-324.
Inoue, et al. "A New Cobalt Salicide Technology for 0.15-j.Jm CMOS Devices" IEEE Transactions on Electron Devices, vol. 45, No. 11, (Nov. 1998), pp. 2312-2318.
Johnson "Magnetoelectronic memories last and last . . . " IEEE Spectrum, Feb. 2000, pp. 33-40.
Kim, et al. "Atomic Layer Deposition of Low Resistivity and High-Density Tungsten Nitride Thin Film Using B2H6, WF6 and NH3," Electrochem. Solid-State Lett., vol. 9, Issue 3, (2006), pp. C54-C57.
Kim, et al. "Investigation of Chemical Vapor Deposition (CVD)—Derived Cobalt Silicidation for the Improvement of Contact Resistance," Japanese Journal of Applied Physics, vol. 44, No. 6A, 2005, pp. 3828-3831.
Klaus, et al. "Automatic Layer Deposition Si02 Using Catalyzed and Uncatalyzed Self-Limiting Surface Reactions," Surface Review and Letters, vol. 6, Nos. 3 & 4, (1999), pp. 435-448.
Klaus, et al, "Atomically Controlled Growth of Tungsten and Tungsten Nitride Using Sequential Surface Reactions," Applied Surface Science, 162-163 (2000), pp. 479-491.
Kotaki et al. "Novel Oxygen Free Titanium Silicidation (OFS) Processing for Low Resistance and Termally Stable SALICIDE (Self-Aligned Silicide) in Deep Submicron Dual Gate CMOS, (Complementary Metal-Oxide Semiconductors)", Jpn. J. Appl. Phys. vol. 34 (1995), Part 1, No. 28, Feb. 1995, pp. 776-781.
Kukli, et al. "Atomic Layer Epitaxy Growth of Tantalum Oxide Thin Films from Ta(OC2H5)s and H20," Journal of the Electrochemical Society, vol. 142, No. 5, May 1995; pp. 1670-1675.
Kukli, et al. "In situ Study of Atomic Layer Epitaxy Growth of Tantalum Oxide Thin Films From Ta(OC2Hs)s and H20," Applied Surface Science, vol. 112, Mar. 1997, pp. 236-242.
Kukli, et al. "Properties of {Nb1-xTax}20sSolid Solutions and {Nb1-xTax}20s-Zr02 Nanolaminates Grown by Atomic Layer Epitaxy," NanoStrucutred Materials, vol. 8, No, 7, Elsevier Science Ltd., 1997; pp. 785-793.
Kukli, et al. "Properties of Ta20s-Based Dielectric Nanolaminates Deposited by Atomic Layer Epitaxy," Journal of the Electrochemical Society, Vol. 144, No. 1, Jan. 1997; pp. 300-306.
Lavoie, et al. "Effects of Alloying Elements on Cobalt Silicide Formation," NSLS Activity Report, Science Highlights, 2001, pp, 2-16-2-20.
Lavoie, et al. "Nickel silicide technology," Silicide Technol. Intergr. Circuits, 2004, pp. 95-151.
Lee, et al. "Excellent conformal deposition obtained of pure Co Films by MOCVD using Co2(CO)a as a Co precursor," http:/www.samsung.com/AboutSAMSUNG.ELECTRONICSGLOBAUSociaiCommitment!Humantech These/WinningPapers/downloads/11 th/silverproze/LeeJeonGil. pdf.
Lee, et al. "Pulsed Nucleation for Ultra-High Aspect Ratio Tungsten Plugfill," Materials Research Society, 2002, pp. 649-653.
Lim, et al. "Atomic layer deposition of transition metals," Nature Materials, vol. 2, Nov. 2003, pp. 749-754.
Liu et al. "New rare-earth permanent magnets with an intrinsic coercivity of 10 kOe at 500° C.," Journal of Applied Physics, vol. 85, No. 8, Apr. 15, 1999, pp. 5660-5662.
Martensson, et al. "Use of Atomic Layer Epitaxy for Fabrication of SifTiN/Cu Structures," J. Vac. Sci. & Tech. B. vol. 17, No. 5, (Sep. 1999), pp. 2122-2128.
Min, et al. "Atomic Layer Deposition of TiN Thin Films by Sequential Introduction of Ti Precursor and NH3," Mat. Res. Soc, Symp. Proc, vol. 514 (1998), pp. 337-343.
Min, et al. "Chemical Vapor Deposition of Ti-Si-N Films With Alternating Source Supply," Mat. Rec. Soc, Symp. Proc, vol. (1999), pp. 207-210.

Min, et al. "Metal-organic Atomic-layer Depositon of Titanium-silicon-nitride films," Applied Physics Letters, vol. 75, No. 11 (Sep. 13, 1999), pp. 1521-1523.
Murarka et al., "Copper Metallization for ULSI and Beyond," Critical Reviews in Solid State and Materials Sciences, vol. 20, No. 2, (1995) pp. 87-124.
Niinisto, et al. "Synthesis of Oxide Thin Films and Overlayers by Atomic Layer Epitaxy for Advanced Applications," Materials Science and Engineering 841 (1996) pp. 23-29.
Park, et al. "Performance improvement of MOSFET with Hf02-A1203 laminate gate dielectric and CVD-TaN metal gate deposited by TAIMATA," Electron Devices Meeting, 2003, IEDM '03 Technical Digest. IEEE International Dec. 8-10, 2003, pp. 13.6.1-13.6.4.
Parkin et al. "Exchange-biased magnetic tunnel junctions and application to nonvolatile magnetic random access memory (invited)," Journal of Applied Physics, vol. 85, No. 8, Apr. 15, 1999, pp. 5828-5833 IJGnathan Han/ 07/1612015 L.
PCT International Partial Search Report for International Application No. PCT/US02/23581 dated Sep. 9, 2003.
PCT International Partial Search Report for International Application No. PCT/US02/23578 dated Apr. 15, 2004.
PCT International Search Report and Written Opinion dated Oct. 23, 2007 for International Application No. PCT/US 07/66442.
PCT International Search Report for International Application No. PCT/US02/23578 dated Jul. 8, 2004.
PCT International Written Opinion for International Application No. PCT/US02/23578 dated Feb. 11, 2005.
Posadowski et al. "Sustained self-sputtering using a direct current magnetron source," Journal of Vaccum Science and Technology, A vol. 11, No. 6, Nov./Dec. 1993, pp. 2980-2984.
Proceedingsof the ICEEE 1998 international Interconnect Technology Conference—San Francisco, California, Jun. 1-3, 1998.
Ritala, et al. "Atomic Force Microscopy Study of Titanium Dioxide Thin Films Grown by Atomic Layer Epitaxy," Thin Solid Films, vol. 228, No. 1-2 (May 15, 1993), pp. 32-35.
Ritala, et al. "Atomic Layer Epitaxy Growth of TiN Thin Films from Til4 and NH3," J. Electrochem. Soc., vol. 145, No. 8 (Aug. 1998), pp. 2914-2920.
Ritala, et al. "Atomic Layer Epitaxy Growth of TiN Thin Films," J. Electrochem. Soc., vol. 142, No. 8, Aug. 1995, pp. 2731-2737.
Ritala, et al. "Effects of Intermediate Zinc Pushes on Properties of TiN and NbN Films by Atomic Layer Epitaxy," Applied Surface Science, vol. 120, No. 3-4, (Dec. 1997), pp. 199-212.
Ritala, et al. "Growth of Titanium Dioxide Thin Films by Atomic Layer Epitaxy," Thin Solid Films, vol. 225, No. 1-2 (Mar. 25, 1993), pp. 288-295.
Ritala, et al. "Perfectly Conformal TiN and Alz03 Films Deposited by Atomic Layer Deposition," Chemical Vapor Deposition, Jan. 1999, 5, No. 1, pp. 6-9.
Ritala, et al. "Surface Roughness Reduction in Atomic Layer Epitaxy Growth of Titanium Dioxide Thin Films," Thin Solid-Films, vol. 249, No. 2 (Sep. 15, 1994), pp. 155-162.
Rossnagel, et al. "Plasma-enhanced Atomic Layer Deposition of Ta and Ti for Interconnect Diffusion Barriers," J. Vaccum Sci. & Tech. B., vol. 18, No. 4 (Jul. 2000), pp. 2016-2020.
Shenai, et al. "Correlation of vapor pressure equation and film properties with trimethylindium purity for the MOVPE grown 111-V compounds," Journal of Crystal Growth 248 (2003), pp. 91-98.
Tehrani et al., "High density submicron magnetoresistive random access memory (invited)," Journal of Applied Physics, vol. 85, No. 8, Apr. 15, 1999, pp. 5822-5827.
Yang, et al. "Atomic Layer Deposition of Tungsten Film from WFs/BzH6: Nucleation Layer for Advanced Semiconductor Devices," Conference Proceedings ULSI XVII (2002), Materials Research Society, pp. 655-660.
Yun, et al. "Highly Scalable PVD/CVD-Cobalt Bilayer Salicidation Technology for sub-50nm CMOSFETs," 207th ECS Meeting—Quebec City, Canada, May 15-20, 2005.
Zorpette, "The Quest for the SP", IEEE Spectrum, Dec. 2001, pp. 30-35.

(56) References Cited

OTHER PUBLICATIONS

Office Action for U.S. Appl. No. 12/201,976 dated Dec. 22, 2010.
Final Office Action for U.S. Appl. No. 12/201,976 dated Jun. 23, 2011.
Notice of Allowance for U.S Appl. No. 12/201,976 dated May 11, 2015.
Office Action for Chinese Application No. 200980134172.5 dated Dec. 24, 2014.
Office Action for Japanese Application No. 2011-525098 dated Dec. 2, 2014.
Search Report and Office Action for Taiwan Application No. 98128269 dated Apr. 30, 2015.
Office Action for Chinese Application No. 200980134172.5 dated Sep. 8, 2015.

COBALT DEPOSITION ON BARRIER SURFACES

CROSS-REFERENCE TO RELATED APPLICATIONS

This application is a continuation of U.S. Ser. No. 12/201,976, filed on Aug. 29, 2008 which is a continuation-in-part of U.S. Ser. No. 12/111,923, filed Apr. 29, 2008 and is a continuation-in-part of U.S. Ser. No. 12/111,930, filed Apr. 29, 2008, which are both continuation-in-parts of U.S. Ser. No. 11/733,929, filed Apr. 11, 2007, which are all herein incorporated by reference in their entirety. U.S. Ser. No. 11/733,929 claims benefit of U.S. Ser. No. 60/791,366, filed Apr. 11, 2006, and U.S. Ser. No. 60/863,939, filed Nov. 1, 2006, and is also a continuation-in-part of U.S. Ser. No. 11/456,073, filed Jul. 6, 2006, and issued as U.S. Pat. No. 7,416,979, which is a continuation of U.S. Ser. No. 10/845,970, filed May 14, 2004, and now abandoned, which is a continuation of U.S. Ser. No. 10/044,412, filed Jan. 9, 2002, and issued as U.S. Pat. No. 6,740,585, which is a continuation-in part of U.S. Ser. No. 09/916,234, filed Jul. 25, 2001, and now abandoned, which are all herein incorporated by reference in their entirety.

BACKGROUND OF THE INVENTION

1. Field of the Invention

Embodiments of the invention generally relate to a metallization process for manufacturing electronic and semiconductor devices, more particularly, embodiments relate to a method for depositing a cobalt layer on a barrier layer before depositing a conductive layer or contact material thereon.

2. Description of the Related Art

Copper is the current metal of choice for use in multilevel metallization processes that are crucial to device manufacturing. The multilevel interconnects that drive the manufacturing processes require planarization of high aspect ratio apertures including contacts, vias, lines, and other features. Filling the features without creating voids or deforming the feature geometry is more difficult when the features have higher aspect ratios. Reliable formation of interconnects is also more difficult as manufacturers strive to increase circuit density and quality.

As the use of copper has permeated the marketplace because of its relative low cost and processing properties, semiconductor manufacturers continue to look for ways to improve the boundary regions between copper and dielectric material by reducing copper diffusion and dewetting. Several processing methods have been developed to manufacture copper interconnects as feature sizes have decreased. Each processing method may increase the likelihood of errors such as copper diffusion across boundary regions, copper crystalline structure deformation, and dewetting. Physical vapor deposition (PVD), chemical vapor deposition (CVD), atomic layer deposition (ALD), electrochemical plating (ECP), electroless deposition, chemical mechanical polishing (CMP), electrochemical mechanical polishing (ECMP), and other methods of depositing and removing copper layers utilize mechanical, electrical, or chemical methods to manipulate the copper that forms the interconnects. Barrier and capping layers may be deposited to contain the copper.

In the past, a layer of tantalum, tantalum nitride, or copper alloy with tin, aluminum, or magnesium was used to provide a barrier layer or an adhesion promoter between copper and other materials. These options are usually costly and are only partially effective. As the copper atoms along the boundary regions experience changes in temperature, pressure, atmospheric conditions, or other process variables common during multiple step semiconductor processing, the copper may migrate along the boundary regions and become agglomerated copper. The copper may also be less uniformly dispersed along the boundary regions and become dewetted copper. These changes in the boundary region include stress migration and electromigration of the copper atoms. The stress migration and electromigration of copper across the dielectric layers or other structures increases the resistivity of the resulting structures and reduces the reliability of the resulting devices.

Therefore, a need exists to enhance the stability and adhesion of a conductive layer or a contact material on a barrier layer. Also, a need exists to improve the electromigration reliability of a copper-containing layer, especially for copper line formations, while preventing the diffusion of copper into neighboring materials, such as dielectric materials.

SUMMARY OF THE INVENTION

Embodiments of the invention provide processes for depositing a cobalt layer on a barrier layer prior to depositing a conductive layer thereon. In one embodiment, a method for depositing materials on a substrate surface is provided which includes forming a barrier layer on a substrate, exposing the substrate to dicobalt hexacarbonyl butylacetylene (CCTBA) and hydrogen ($H_2$) to form a cobalt layer on the barrier layer during a vapor deposition process, and depositing a conductive material over the cobalt layer.

In one example, the substrate may be exposed to a deposition gas containing CCTBA and hydrogen during a thermal CVD process. In another example, the substrate may be sequentially exposed to CCTBA and hydrogen during an ALD process. The substrate may be heated to a temperature within a range from about 100° C. to about 250° C. during the CVD or ALD process. The cobalt layer may be deposited with a thickness of less than about 40 Å.

In some examples, the barrier layer and/or the cobalt layer may be exposed to a gas or a reagent during a treatment process. The treatment may be a thermal process, an in situ plasma process, or a remote plasma process. The gas or the reagent may contain or be nitrogen ($N_2$), ammonia ($NH_3$), hydrogen ($H_2$), an ammonia/hydrogen mixture, silane, disilane, helium, argon, plasmas thereof, derivatives thereof, or combinations thereof. The barrier layer or the cobalt layer may be exposed to the gas, reagent, or plasma for a time period within a range from about 1 second to about 30 seconds. The substrate may be heated to a temperature within a range from about 50° C. to about 400° C. during the treatment process.

In some examples, the conductive material may contain copper or a copper alloy. The conductive material may contain a seed layer and a bulk layer. Alternatively, the conductive material may be directly deposited on the cobalt layer, such as by an electrochemical plating (ECP) process. In one example, a seed layer containing copper may be deposited by a PVD process or a CVD process. In another example, the bulk layer contains copper and may be deposited by an ECP process. The barrier layer may contain tantalum, tantalum nitride, titanium, titanium nitride, tungsten, tungsten nitride, alloys thereof, derivatives thereof, or combinations thereof. In one example, the barrier layer may be a tantalum nitride layer disposed on a tantalum layer.

In another embodiment, a method for depositing materials on a substrate surface is provided which includes forming a barrier layer on a substrate, exposing the barrier layer to a first plasma during a pre-treatment process, exposing the substrate to CCTBA and hydrogen to form a cobalt layer on the barrier layer during a vapor deposition process, exposing the cobalt layer to a second plasma during a post-treatment process, and depositing a copper layer on the cobalt layer by a vapor deposition process, such as a PVD process or a CVD process.

In another embodiment, a method for depositing materials on a substrate surface is provided which includes forming a barrier layer on a substrate, exposing the barrier layer to a plasma during a pre-treatment process, exposing the substrate to CCTBA and a reducing gas to form a cobalt layer on the barrier layer during a vapor deposition process, exposing the cobalt layer to a hydrogen plasma during a post-treatment process, and depositing a copper material over the cobalt layer. In one example, the vapor deposition process to deposit the cobalt layer and the post-treatment process are sequentially repeated to form a cobalt material. The cobalt material contains multiple cobalt layers which have each been exposed to a hydrogen plasma prior to having another cobalt layer deposited thereon.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention provide a method for depositing a cobalt layer on a barrier layer or layer prior to depositing a conductive layer thereon. The cobalt layer and barrier layer may each optionally be exposed to a treatment process, such as a plasma process or a thermal process. The conductive layer may contain copper or a copper alloy and be deposited by a physical vapor deposition (PVD) process, an atomic layer deposition (ALD) process, an electrochemical plating (ECP) process, or an electroless deposition process. The cobalt layer improves copper boundary region properties to promote adhesion, improve gapfill and electromigration performance, decrease diffusion and agglomeration, and encourage uniform roughness and wetting of the substrate surface during processing.

Figure 1:
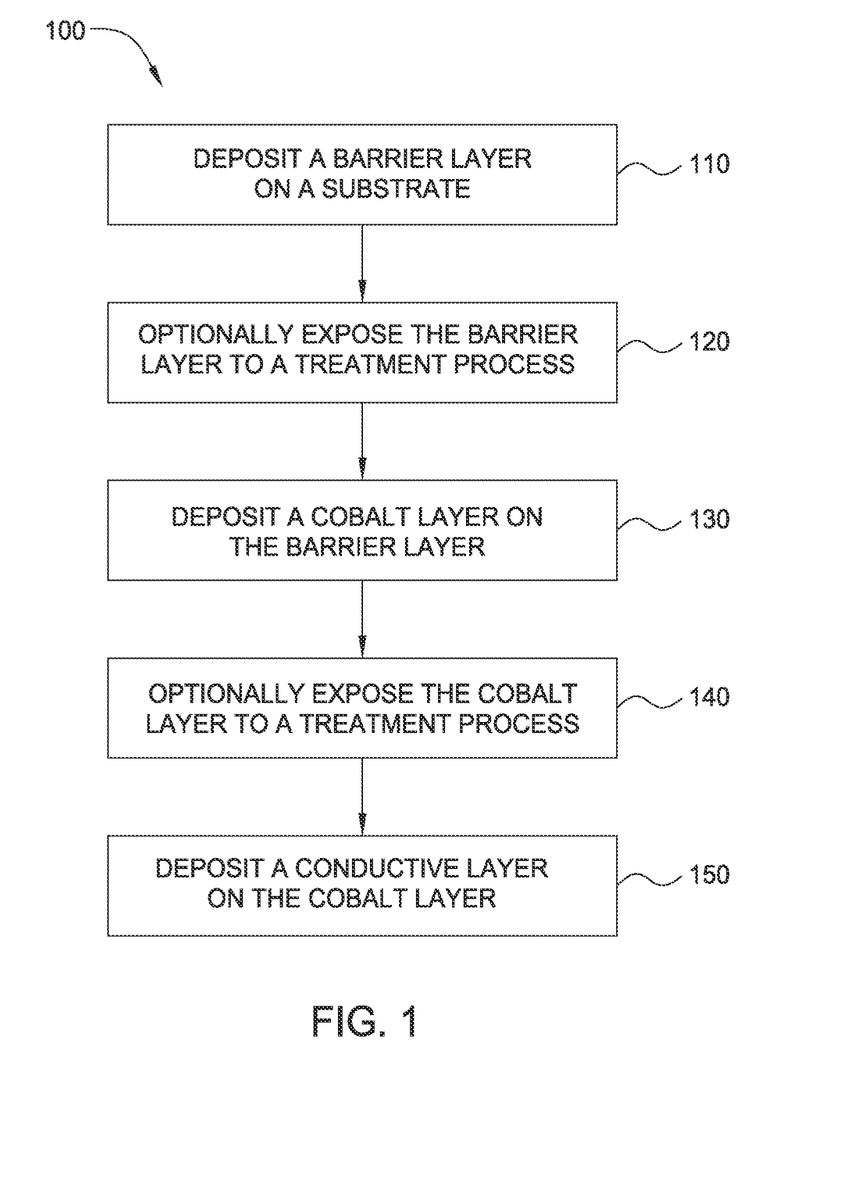
FIG. 1 depicts a flow chart illustrating a process according to an embodiment described herein.

FIG. 1 depicts a flow chart illustrating process 100 according to an embodiment of the invention. Process 100 may be used to form an interconnect or other device on a substrate. In one embodiment, steps 110-150 of process 100 may be performed on substrate 200, depicted in FIGS. 2A-2F. Process 100 includes depositing or forming a barrier layer on a substrate (step 110), optionally exposing the barrier layer to a pre-treatment process (step 120), depositing a cobalt layer on the barrier layer (step 130), optionally exposing the cobalt layer to a post-treatment process (step 140), and depositing at least one conductive layer on the cobalt layer (step 150).

Figure 2A:
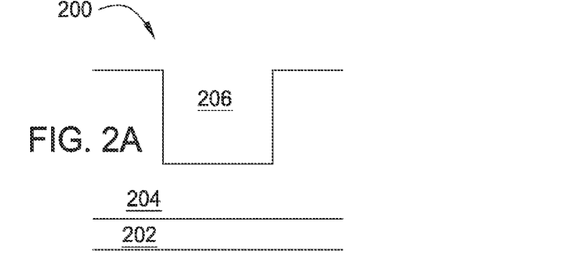
FIGS. 2A-2F depict schematic views of a substrate at different process steps according to an embodiment described herein.

FIG. 2A depicts substrate 200 containing dielectric layer 204 disposed over underlayer 202. Aperture 206 is formed within dielectric layer 204 and may be a via, damascene, trough, or other passageway formed therein. Underlayer 202 may be a substrate, substrate surface, contact layer, or another layer depending on device structure. Dielectric layer 204 may contain a dielectric material, such as a low-k dielectric material. In one example, dielectric layer 204 contains a low-k dielectric material, such as a silicon carbide oxide material, or a carbon doped silicon oxide material, for example, BLACK DIAMOND® II low-k dielectric material, available from Applied Materials, Inc., located in Santa Clara, Calif. Another example of a suitable material for dielectric layer 204 is a silicon carbide based film formed using chemical vapor deposition (CVD) or plasma enhanced CVD (PE-CVD) processes such as described in commonly assigned U.S. Pat. Nos. 6,537,733, 6,790,788, and 6,890,850, which are incorporated herein by reference.

Figure 2B:
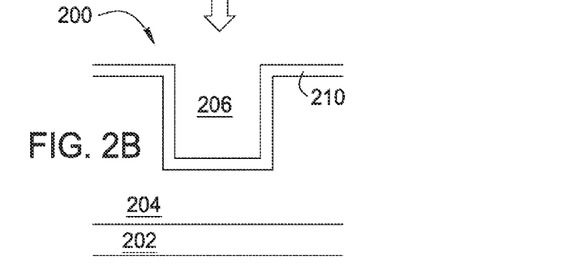

In one embodiment, at least one barrier layer or material may be deposited or formed on a substrate during step 110 of process 100. In one example, FIG. 2B depicts barrier layer 210 disposed on substrate 200, over dielectric layer 204, and conformally within aperture 206. Barrier layer 210 may be one layer or multiple layers. Barrier layer 210 may contain titanium, titanium nitride, tantalum, tantalum nitride, tungsten, tungsten nitride, silicides thereof, derivatives thereof, or combinations thereof. In some embodiments, barrier layer 210 may contain a bilayer of tantalum/tantalum nitride, titanium/titanium nitride, or tungsten/tungsten nitride. Barrier layer 210 may have a thickness within a range from about 5 Å to about 50 Å, preferably, from about 10 Å to about 30 Å, and may be formed or deposited by PVD, ALD, plasma enhanced ALD (PE-ALD), CVD, PE-CVD, pulsed-CVD, or combinations thereof.

In one example, barrier layer 210 contains a lower layer of metallic tantalum deposited by a PVD process and an upper layer disposed over the lower layer of tantalum nitride layer deposited by another PVD process. In another example, barrier layer 210 contains a lower layer of metallic tantalum deposited by an ALD process and an upper layer disposed over the lower layer of tantalum nitride layer deposited by a CVD process. In another example, barrier layer 210 contains a lower layer of metallic tantalum deposited by a PVD process and an upper layer disposed over the lower layer of tantalum nitride layer deposited by a CVD process.

For example, barrier layer 210 may contain tantalum nitride deposited using a CVD process or an ALD process wherein tantalum-containing compound or tantalum precursor (e.g., PDMAT) and nitrogen precursor (e.g., ammonia) are reacted. In one embodiment, tantalum and/or tantalum nitride is deposited as barrier layer 210 by an ALD process as described in commonly assigned U.S. Ser. No. 10/281,079, filed Oct. 25, 2002, and published as US 2003-0121608, which is herein incorporated by reference. In one example, a Ta/TaN bilayer may be deposited as barrier layer 210, such as a metallic tantalum layer and a tantalum nitride layer that are independently deposited by ALD, CVD, and/or PVD processes, one layer on top of the other layer, in either order.

In another example, a Ti/TiN bilayer may be deposited as barrier layer 210, such as a metallic titanium layer and a titanium nitride layer that are independently deposited by ALD, CVD, and/or PVD processes, one layer on top of the other layer, in either order. In another example, a W/WN bilayer may be deposited as barrier layer 210, such as a metallic tungsten layer and a tungsten nitride layer that are independently deposited by ALD, CVD, and/or PVD processes, one layer on top of the other layer, in either order.

At step 120, barrier layer 210 may be optionally exposed to a pre-treatment process, such as a plasma process or a thermal process. Process gases and/or reagents that may be exposed to substrate 200 during plasma or thermal pre-treatment processes include hydrogen (e.g., $H_2$ or atomic-H), nitrogen (e.g., $N_2$ or atomic-N), ammonia ($NH_3$), a hydrogen and ammonia mixture ($H_2/NH_3$), hydrazine ($N_2H_4$), silane ($SiH_4$), disilane ($Si_2H_6$), helium, argon, derivatives thereof, plasmas thereof, or combinations thereof. The process gas may flow into the processing chamber or be exposed to the substrate having a flow rate within a range from about 500 sccm to about 10 slm, preferably, from about 1 slm to about 6 slm, for example, about 3 slm.

In one embodiment, substrate 200 and barrier layer 210 may be exposed to a plasma to remove contaminants from barrier layer 210 during the pre-treatment process at step 120. Substrate 200 may be positioned within a processing chamber and exposed to a process gas which is ignited to form the plasma. The process gas may contain one gaseous compound or multiple gaseous compounds. Substrate 200 may be at room temperature (e.g., 23° C.), but is usually preheated to the desired temperature of the subsequent deposition process. Substrate 200 may be heated to a temperature within a range from about 100° C. to about 400° C., preferably, from about 125° C. to about 350° C., and more preferably, from about 150° C. to about 300° C., such as about 200° C. or about 250° C.

The processing chamber may produce an in situ plasma or be equipped with a remote plasma source (RPS). In one embodiment, substrate 200 may be exposed to the plasma (e.g., in situ or remotely) for a time period within a range from about 0.5 seconds to about 90 seconds, preferably, from about 10 seconds to about 60 seconds, and more preferably, from about 20 seconds to about 40 seconds. The plasma may be produced at a power within a range from about 100 watts to about 1,000 watts, preferably, from about 200 watts to about 600 watts, and more preferably, from about 300 watts to about 500 watts. The processing chamber usually has an internal pressure of about 100 Torr or less, such as within a range from about 0.1 Torr to about 100 Torr, preferably, from about 0.5 Torr to about 50 Torr, and more preferably, from about 1 Torr to about 10 Torr.

In one example, substrate 200 and barrier layer 210 may be exposed to a plasma generated from hydrogen, ammonia, nitrogen, or mixtures thereof. In another example, substrate 200 and barrier layer 210 may be exposed to a plasma generated from hydrogen and ammonia. In another example, substrate 200 and barrier layer 210 may be exposed to a plasma generated from hydrogen, nitrogen, silane, disilane, or mixtures thereof. In another example, substrate 200 and barrier layer 210 may be exposed to a plasma generated from hydrogen, nitrogen, argon, helium, or mixtures thereof.

In another embodiment, substrate 200 and barrier layer 210 are exposed to a process gas to remove contaminants from barrier layer 210 during a thermal pre-treatment process at step 120. The thermal pre-treatment process may be a rapid thermal process (RTP) or a rapid thermal annealing (RTA) process. Substrate 200 may be positioned within a processing chamber and exposed to at least one process gas and/or reagent. The processing chamber may be a deposition chamber that will be used for a subsequent deposition process, such as a PVD chamber, a CVD chamber, or an ALD chamber. Alternatively, the processing chamber may be a thermal annealing chamber, such as the RADIANCE® RTA chamber, commercially available from Applied Materials, Inc., Santa Clara, Calif. Substrate 200 may be heated to a temperature within a range from about 25° C. to about 800° C., preferably, from about 50° C. to about 400° C., and more preferably, from about 100° C. to about 300° C. Substrate 200 may be heated for a time period within a range from about 2 minutes to about 20 minutes, preferably, from about 5 minutes to about 15 minutes. For example, substrate 200 may be heated to about 400° C. for about 12 minutes within the processing chamber.

In one example, substrate 200 and barrier layer 210 may be exposed to hydrogen, ammonia, nitrogen, or mixtures thereof while being heated within the processing chamber. In another example, substrate 200 and barrier layer 210 may be exposed to an ammonia/hydrogen mixture while being heated within the processing chamber. In another example, substrate 200 and barrier layer 210 may be exposed to hydrogen, nitrogen, silane, disilane, or mixtures thereof while being heated within the processing chamber. In another example, substrate 200 and barrier layer 210 may be exposed to hydrogen, nitrogen, argon, helium, or mixtures thereof while being heated within the processing chamber.

Figure 2C:
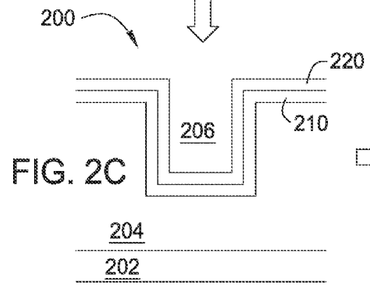

In another embodiment, at least cobalt material or layer may be deposited or formed on the substrate during step 130 of process 100. In one example, FIG. 2C depicts cobalt layer 220 disposed on substrate 200, over barrier layer 210, and conformally within aperture 206. Cobalt layer 220 is usually a single layer, but may contain multiple layers. Cobalt layer 220 may be a continuous layer or a discontinuous layer across barrier layer 210. Cobalt layer 220 may have a thickness of about 40 Å or less, such as within a range from about 2 Å to about 40 Å, preferably, from about 5 Å to about 30 Å. Cobalt layer 220 may be formed or deposited by a vapor deposition process, such as CVD, PE-CVD, pulsed-CVD, ALD, PE-ALD, or PVD. The plasma enhanced vapor deposition process, namely PE-CVD and PE-ALD, may be an in situ plasma process within the processing chamber or may be a remote plasma process such that a plasma is ignited in by a RPS and directed into the processing chamber. In many examples, cobalt layer 220 contains metallic cobalt. Alternatively, in other examples, cobalt layer 220 may contain one or more cobalt materials, such as metallic cobalt, cobalt silicide, cobalt boride, cobalt phosphide, alloys thereof, derivatives thereof, or combinations thereof.

In some embodiments, cobalt layer 220 may be formed or deposited by simultaneously introducing a cobalt precursor and a reagent into the processing chamber during a thermal CVD process, a pulsed-CVD process, a PE-CVD process, or a pulsed PE-CVD process. In other embodiments, the cobalt precursor may be introduced into the processing chamber without a reagent during a thermal CVD process, a pulsed-CVD process, a PE-CVD process, or a pulsed PE-CVD process. Alternatively, in other embodiments, cobalt layer 220 may be formed or deposited by sequentially introducing a cobalt precursor and a reagent into the processing chamber during a thermal ALD process or a PE-ALD process.

Cobalt layer 220 may contain metallic cobalt in some examples, but may contain other cobalt materials in other examples. Suitable cobalt precursors for forming cobalt materials (e.g., metallic cobalt or cobalt alloys) by CVD or ALD processes described herein include cobalt carbonyl complexes, cobalt amidinates compounds, cobaltocene compounds, cobalt dienyl complexes, cobalt nitrosyl complexes, derivatives thereof, complexes thereof, plasmas thereof, or combinations thereof. In some embodiments, cobalt materials may be deposited by CVD and ALD processes further described in commonly assigned U.S. Pat. Nos. 7,264,846 and 7,404,985, which are herein incorporated by reference.

In some embodiments, cobalt carbonyl compounds or complexes may be utilized as cobalt precursors. Cobalt carbonyl compounds or complexes have the general chemical formula $(CO)_xCo_yL_z$, where X may be 1, 2, 3, 4, 5, 6, 7, 8, 9, 10, 11, or 12, Y may be 1, 2, 3, 4, or 5, and Z may be 1, 2, 3, 4, 5, 6, 7, or 8. The group L is absent, one ligand or multiple ligands, that may be the same ligand or different ligands, and include cyclopentadienyl, alkylcyclopentadienyl (e.g., methylcyclopentadienyl or pentamethylcyclopentadienyl), pentadienyl, alkylpentadienyl, cyclobutadienyl, butadienyl, ethylene, allyl (or propylene), alkenes, dialkenes, alkynes, acetylene, butylacetylene, nitrosyl, ammonia, derivatives thereof, complexes thereof, plasmas thereof, or combinations thereof.

In one embodiment, dicobalt hexacarbonyl acetyl compounds may be used to form cobalt materials (e.g., cobalt layer 220) during a deposition process. Dicobalt hexacarbonyl acetyl compounds may have the chemical formula of $(CO)_6Co_2(RC\equiv CR')$, wherein R and R' are independently selected from hydrogen, methyl, ethyl, propyl, isopropyl, butyl, tertbutyl, penta, benzyl, aryl, isomers thereof, derivatives thereof, or combinations thereof. In one example, dicobalt hexacarbonyl butylacetylene (CCTBA, $(CO)_6Co_2(HC\equiv C^tBu)$) is the cobalt precursor. Other examples of dicobalt hexacarbonyl acetyl compounds include dicobalt hexacarbonyl methyl butylacetylene $((CO)_6Co_2(MeC\equiv C^tBu))$, dicobalt hexacarbonyl phenylacetylene $((CO)_6Co_2(HC\equiv CPh))$, hexacarbonyl methyl phenylacetylene $((CO)_6Co_2(MeC\equiv CPh))$, dicobalt hexacarbonyl methylacetylene $((CO)_6Co_2(HC\equiv CMe))$, dicobalt hexacarbonyl dimethylacetylene $((CO)_6Co_2(MeC\equiv CMe))$, derivatives thereof, complexes thereof, plasmas thereof, or combinations thereof. Other exemplary cobalt carbonyl complexes include cyclopentadienyl cobalt bis(carbonyl) $(CpCo(CO)_2)$, tricarbonyl allyl cobalt $((CO)_3Co(CH_2CH\equiv CH_2))$, derivatives thereof, complexes thereof, plasmas thereof, or combinations thereof.

In another embodiment, cobalt amidinates or cobalt amido complexes may be utilized as cobalt precursors. Cobalt amido complexes have the general chemical formula $(RR'N)_xCo$, where X may be 1, 2, or 3, and R and R' are independently hydrogen, methyl, ethyl, propyl, butyl, alkyl, silyl, alkylsilyl, derivatives thereof, or combinations thereof. Some exemplary cobalt amido complexes include bis(di(butyldimethylsilyl)amido) cobalt $(((BuMe_2Si)_2N)_2Co)$, bis(di(ethyldimethylsilyl)amido) cobalt $(((EtMe_2Si)_2N)_2Co)$, bis(di(propyldimethylsilyl)amido) cobalt $(((PrMe_2Si)_2N)_2Co)$, bis(di(trimethylsilyl)amido) cobalt $(((Me_3Si)_2N)_2Co)$, tris(di(trimethylsilyl)amido) cobalt $(((Me_3Si)_2N)_3Co)$, derivatives thereof, complexes thereof, plasmas thereof, or combinations thereof.

Some exemplary cobalt precursors include methylcyclopentadienyl cobalt bis(carbonyl) $(MeCpCo(CO)_2)$, ethylcyclopentadienyl cobalt bis(carbonyl) $(EtCpCo(CO)_2)$, pentamethylcyclopentadienyl cobalt bis(carbonyl) $(Me_5CpCo(CO)_2)$, dicobalt octa(carbonyl) $(Co_2(CO)_8)$, nitrosyl cobalt tris(carbonyl) $((ON)Co(CO)_3)$, bis(cyclopentadienyl) cobalt, (cyclopentadienyl) cobalt (cyclohexadienyl), cyclopentadienyl cobalt (1,3-hexadienyl), (cyclobutadienyl) cobalt (cyclopentadienyl), bis(methylcyclopentadienyl) cobalt, (cyclopentadienyl) cobalt (5-methylcyclopentadienyl), bis(ethylene) cobalt (pentamethylcyclopentadienyl), cobalt tetracarbonyl iodide, cobalt tetracarbonyl trichlorosilane, carbonyl chloride tris(trimethylphosphine) cobalt, cobalt tricarbonyl-hydrotributylphosphine, acetylene dicobalt hexacarbonyl, acetylene dicobalt pentacarbonyl triethylphosphine, derivatives thereof, complexes thereof, plasmas thereof, or combinations thereof.

In some examples, alternative reagents, including reducing agents, may be used to react with cobalt precursors while forming cobalt materials (e.g., metallic cobalt or cobalt alloys) by processes described herein include hydrogen (e.g., $H_2$ or atomic-H), nitrogen (e.g., $N_2$ or atomic-N), ammonia ($NH_3$), hydrazine ($N_2H_4$), a hydrogen and ammonia mixture ($H_2/NH_3$), borane ($BH_3$), diborane ($B_2H_6$), triethylborane ($Et_3B$), silane ($SiH_4$), disilane ($Si_2H_6$), trisilane ($Si_3H_8$), tetrasilane ($Si_4H_{10}$), methyl silane ($SiCH_6$), dimethylsilane ($SiC_2H_8$), phosphine ($PH_3$), derivatives thereof, plasmas thereof, or combinations thereof.

In one embodiment, cobalt layer 220 containing metallic cobalt is deposited by simultaneously exposing substrate 200 to a cobalt precursor gas and a reducing agent during a thermal CVD process. In an alternative embodiment, cobalt layer 220 containing metallic cobalt is deposited by simultaneously exposing substrate 200 to a cobalt precursor gas and a reducing agent gas during a plasma enhanced CVD process. The plasma source may be an in situ plasma source within the CVD chamber or a RPS positioned outside of the CVD chamber. The cobalt precursor gas may be formed by passing a carrier gas (e.g., nitrogen or argon) through an ampoule of a cobalt precursor (e.g., CCTBA). The reducing agent gas may be a single compound (e.g., $H_2$), and therefore have no carrier gas. Alternatively, the reducing agent gas may be formed by passing a carrier gas through an ampoule of a reducing agent.

The ampoule may be heated depending on the cobalt precursor or reducing agent used during the process. In one example, an ampoule containing a cobalt precursor, such as a dicobalt hexacarbonyl acetyl compound or other cobalt carbonyl compound (e.g., $(CO)_xCo_yL_z$) may be heated to a temperature within a range from about 30° C. to about 500° C. The cobalt precursor gas usually has a flow rate within a range from about 100 sccm (standard cubic centimeters per minute) to about 2,000 sccm, preferably, from about 200 sccm to about 1,000 sccm, and more preferably, from about 300 sccm to about 700 sccm, for example, about 500 sccm. The reducing agent gas usually has a flow rate within a range from about 0.5 slm (standard liters per minute) to about 10 slm, preferably, from about 1 slm to about 8 slm, and more preferably, from about 2 slm to about 6 slm. In one example, reducing agent gas is hydrogen and has a flow rate within a range from about 2 slm to about 6 slm, such as about 4 slm.

The cobalt precursor gas and the reducing agent gas may be combined to form a deposition gas prior to, while, or subsequent to entering the processing chamber during a deposition process to deposit cobalt layer 220. Substrate 200 may be positioned within a processing chamber and heated to a temperature within a range from about 25° C. to about 800° C., preferably, from about 50° C. to about 400° C., and more preferably, from about 100° C. to about 250° C., such as about 150° C. Once at a predetermined temperature, substrate 200 may be exposed to the deposition gas containing the cobalt precursor gas and the reducing agent gas for a time period within a range from about 0.1 seconds to about 120 seconds, preferably, from about 1 second to about 60 seconds, and more preferably, from about 5 seconds to about 30 seconds. For example, substrate 200 may be heated to about 150° C. for about 10 minutes within the processing chamber while forming cobalt layer 220 during the CVD process.

At step 140, cobalt layer 220 may be optionally exposed to a post-treatment process, such as a plasma process or a thermal process. Process gases and/or reagents that may be exposed to substrate 200 and cobalt layer 220 during plasma or thermal post-treatment processes include hydrogen (e.g., $H_2$ or atomic-H), nitrogen (e.g., $N_2$ or atomic-N), ammonia ($NH_3$), a hydrogen and ammonia mixture ($H_2/NH_3$), hydrazine ($N_2H_4$), silane ($SiH_4$), disilane ($Si_2H_6$), helium, argon, derivatives thereof, plasmas thereof, or combinations thereof. The process gas may flow into the processing chamber or be exposed to the substrate having a flow rate within a range from about 500 sccm to about 10 slm, preferably, from about 1 slm to about 6 slm, for example, about 3 slm.

In one embodiment, substrate 200 and cobalt layer 220 are exposed to a plasma to remove contaminants from cobalt layer 220 during the post-treatment process at step 140. Substrate 200 may be positioned within a processing chamber and exposed to a process gas which is ignited to form the plasma. The process gas may contain one gaseous compound or multiple gaseous compounds. Substrate 200 may be at room temperature (e.g., 23° C.), but is usually preheated to the desired temperature of the subsequent deposition process. Substrate 200 may be heated to a temperature within a range from about 100° C. to about 400° C., preferably, from about 125° C. to about 350° C., and more preferably, from about 150° C. to about 300° C., such as about 200° C. or about 250° C.

The processing chamber may produce an in situ plasma or be equipped with a RPS. In one embodiment, substrate 200 may be exposed to the plasma (e.g., in situ or remotely) for a time period within a range from about 0.5 seconds to about 90 seconds, preferably, from about 10 seconds to about 60 seconds, and more preferably, from about 20 seconds to about 40 seconds. The plasma may be produced at a power within a range from about 100 watts to about 1,000 watts, preferably, from about 200 watts to about 600 watts, and more preferably, from about 300 watts to about 500 watts. The processing chamber usually has an internal pressure of about 100 Torr or less, such as within a range from about 0.1 Torr to about 100 Torr, preferably, from about 0.5 Torr to about 50 Torr, and more preferably, from about 1 Torr to about 10 Torr.

In one example, substrate 200 and cobalt layer 220 may be exposed to a plasma generated from hydrogen, ammonia, nitrogen, or mixtures thereof. In another example, substrate 200 and cobalt layer 220 may be exposed to a plasma generated from hydrogen and ammonia. In another example, substrate 200 and cobalt layer 220 may be exposed to a plasma generated from hydrogen, nitrogen, silane, disilane, or mixtures thereof. In another example, substrate 200 and cobalt layer 220 may be exposed to a plasma generated from hydrogen, nitrogen, argon, helium, or mixtures thereof.

In some examples, substrate 200 and cobalt layer 220 may be exposed to a hydrogen plasma generated from hydrogen gas ignited by a RPS. Cobalt layer 220 may be exposed to hydrogen gas with a flow rate within a range from about 2 slm to about 4 slm. The processing chamber may have an internal pressure within a range from about 1 Torr to about 10 Torr, and the plasma is ignited by a RPS having a power within a range from about 300 watts to about 500 watts. In one embodiment, the plasma may be exposed to cobalt layer 220 for a time period within a range from about 20 seconds to about 40 seconds for every deposited layer of cobalt material having a thickness within a range from about 7 Å to about 10 Å. Multiple treatments may be performed sequentially with the multiple layers of deposited cobalt material while forming cobalt layer 220.

In another embodiment, substrate 200 and cobalt layer 220 are exposed to a process gas to remove contaminants from cobalt layer 220 during a thermal post-treatment process at step 140. The thermal post-treatment process may be a RTP or a RTA process. Substrate 200 may be positioned within a processing chamber and exposed to at least one process gas and/or reagent. The processing chamber may be a deposition chamber that was used in a prior deposition process or will be used for a subsequent deposition process, such as a PVD chamber, a CVD chamber, or an ALD chamber. Alternatively, the processing chamber may be a thermal annealing chamber, such as the RADIANCE® RTA chamber, commercially available from Applied Materials, Inc., Santa Clara, Calif. Substrate 200 may be heated to a temperature within a range from about 25° C. to about 800° C., preferably, from about 50° C. to about 400° C., and more preferably, from about 100° C. to about 300° C. Substrate 200 may be heated for a time period within a range from about 2 minutes to about 20 minutes, preferably, from about 5 minutes to about 15 minutes. For example, substrate 200 may be heated to about 400° C. for about 12 minutes within the processing chamber.

In one example, substrate 200 and cobalt layer 220 may be exposed to hydrogen, ammonia, nitrogen, or mixtures thereof while being heated within the processing chamber. In another example, substrate 200 and cobalt layer 220 may be exposed to an ammonia/hydrogen mixture while being heated within the processing chamber. In another example, substrate 200 and cobalt layer 220 may be exposed to hydrogen, nitrogen, silane, disilane, or mixtures thereof while being heated within the processing chamber. In another example, substrate 200 and cobalt layer 220 may be exposed to hydrogen, nitrogen, argon, helium, or mixtures thereof while being heated within the processing chamber.

Figure 2D:
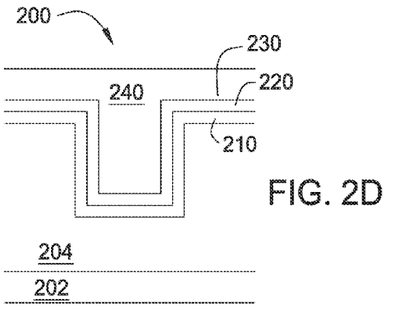
Figure 2E:
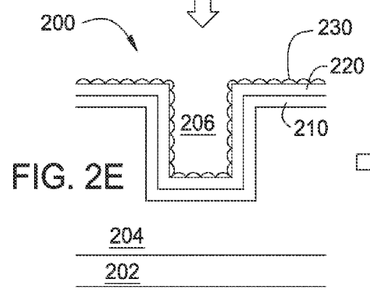
Figure 2F:
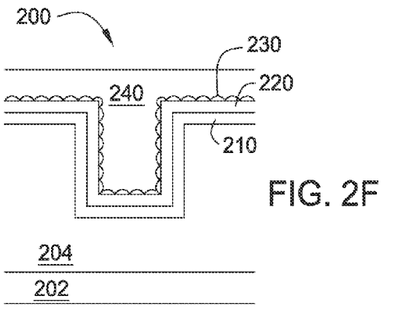

FIG. 2C depicts aperture 206 formed within dielectric layer 204 on substrate 200. Aperture 206 contains barrier layer 210 and cobalt layer 220 conformally disposed therein. In another embodiment, during step 150 of process 100, a conductive layer may be deposited or formed on or over cobalt layer 220. In one embodiment, the conductive layer is bulk layer 240 which may be directly deposited over cobalt layer 220, as depicted in FIG. 2D. Alternatively, in another embodiment, the conductive layer is seed layer 230 and bulk layer 240. Seed layer 230 may be deposited over cobalt layer 220 and subsequently, bulk layer 240 may be deposited over seed layer 230, as depicted in FIGS. 2E-2F.

Seed layer 230 and bulk layer 240 may be deposited or formed during a single deposition process or multiple deposition processes. Seed layer 230 may contain copper, tungsten, aluminum, ruthenium, cobalt, silver, platinum, palladium, alloys thereof, derivatives thereof or combinations thereof. Bulk layer 240 may contain copper, tungsten, aluminum, alloys thereof, derivatives thereof or combinations thereof. Usually, seed layer 230 and bulk layer 240 may independently contain copper, tungsten, aluminum, alloys thereof, derivatives thereof or combinations thereof. Seed layer 230 and bulk layer 240 may independently be deposited by using one or more deposition process, such as a CVD process, an ALD process, a PVD process, an electroless deposition process, an ECP process, derivatives thereof, or combinations thereof.

In one example, each of seed layer 230 and bulk layer 240 contains copper or a copper alloy. For example, seed layer 230 containing copper may be formed on cobalt layer 220 by a PVD process and thereafter, bulk layer 240 containing copper may be deposited to fill aperture 206 by an ECP process or an electroless deposition process. In another example, seed layer 230 containing copper may be formed on cobalt layer 220 by an ALD process and thereafter, bulk layer 240 containing copper may be deposited to fill aperture 206 by an ECP process or an electroless deposition process. In another example, seed layer 230 containing copper may be formed on cobalt layer 220 by a CVD process and thereafter, bulk layer 240 containing copper may be deposited to fill aperture 206 by an ECP process or an electroless deposition process. In another example, seed layer 230 containing copper may be formed on cobalt layer 220 by an electroless process and thereafter, bulk layer 240 containing copper may be deposited to fill aperture 206 by an ECP process or an electroless deposition process. In another example, cobalt layer 220 serves as a seed layer to which bulk layer 240 containing copper may be directly deposited to fill aperture 206 by an ECP process or an electroless deposition process.

In one example, each of seed layer 230 and bulk layer 240 contains tungsten or a tungsten alloy. For example, seed layer 230 containing tungsten may be formed on cobalt layer 220 by a PVD process and thereafter, bulk layer 240 containing tungsten may be deposited to fill aperture 206 by a CVD process or a pulsed-CVD process. In another example, seed layer 230 containing tungsten may be formed on cobalt layer 220 by an ALD process and thereafter, bulk layer 240 containing tungsten may be deposited to fill aperture 206 by a CVD process or a pulsed-CVD process. In another example, seed layer 230 containing tungsten may be formed on cobalt layer 220 by a pulsed-CVD process and thereafter, bulk layer 240 containing tungsten may be deposited to fill aperture 206 by a CVD process or a pulsed-CVD process. In another example, seed layer 230 containing tungsten may be formed on cobalt layer 220 by an electroless process and thereafter, bulk layer 240 containing tungsten may be deposited to fill aperture 206 by a CVD process or a pulsed-CVD process. In another example, cobalt layer 220 serves as a seed layer to which bulk layer 240 containing tungsten may be directly deposited to fill aperture 206 by a CVD process or a pulsed-CVD process.

An ALD processing chamber used during embodiments described herein is available from Applied Materials, Inc., located in Santa Clara, Calif. A detailed description of an ALD processing chamber may be found in commonly assigned U.S. Pat. Nos. 6,916,398 and 6,878,206, commonly assigned U.S. Ser. No. 10/281,079, filed on Oct. 25, 2002, and published as U.S. Pub. No. 2003-0121608, and commonly assigned U.S. Ser. Nos. 11/556,745, 11/556,752, 11/556,756, 11/556,758, 11/556,763, each filed Nov. 6, 2006, and published as U.S. Pub. Nos. 2007-0119379, 2007-0119371, 2007-0128862, 2007-0128863, and 2007-0128864, which are hereby incorporated by reference in their entirety. In another embodiment, a chamber configured to operate in both an ALD mode as well as a conventional CVD mode may be used to deposit cobalt-containing materials is described in commonly assigned U.S. Pat. No. 7,204,886, which is incorporated herein by reference in its entirety. A detailed description of an ALD process for forming cobalt-containing materials is further disclosed in commonly assigned U.S. Pat. Nos. 7,264,846 and 7,404,985, which are hereby incorporated by reference in their entirety. In other embodiments, a chamber configured to operate in both an ALD mode as well as a conventional CVD mode that may be used to deposit cobalt-containing materials is the TXZ® showerhead and CVD chamber available from Applied Materials, Inc., located in Santa Clara, Calif. An example of a suitable vapor deposition chamber includes the WXZ™ CVD chamber, commercially available from Applied Materials, Inc., located in Santa Clara, Calif. The vapor deposition chamber may be adapted to deposit materials by conventional CVD, pulsed-CVD, or PE-CVD techniques as well as by ALD and PE-ALD techniques. Also, the vapor deposition chamber may be used as for treatment processes, such as an in situ plasma process, a remote plasma process, or a thermal annealing process.

"Substrate surface" or "substrate," as used herein, refers to any substrate or material surface formed on a substrate upon which film processing is performed during a fabrication process. For example, a substrate surface on which processing may be performed include materials such as monocrystalline, polycrystalline or amorphous silicon, strained silicon, silicon on insulator (SOI), doped silicon, silicon germanium, germanium, gallium arsenide, glass, sapphire, silicon oxide, silicon nitride, silicon oxynitride, and/or carbon doped silicon oxides, such as $SiO_xC_y$, for example, BLACK DIAMOND® low-k dielectric, available from Applied Materials, Inc., located in Santa Clara, Calif. Substrates may have various dimensions, such as 100 mm, 200 mm, 300 mm, or 450 mm diameter wafers, as well as, rectangular or square panes. Unless otherwise noted, embodiments and examples described herein are usually conducted on substrates with a 200 mm diameter or a 300 mm diameter, more preferably, a 300 mm diameter. Processes of the embodiments described herein may be used to deposit cobalt materials (e.g., metallic cobalt) on many substrates and surfaces, especially, barrier layers and layers. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers, and patterned or non-patterned wafers. Substrates may be exposed to a pre-treatment process to polish, etch, reduce, oxidize, hydroxylate, heat, and/or anneal the substrate or substrate surface.

While the foregoing is directed to embodiments of the invention, other and further embodiments of the invention may be devised without departing from the basic scope thereof, and the scope thereof is determined by the claims that follow.

The invention claimed is:

1. A method for depositing materials on a substrate surface, comprising:
   forming a barrier layer on a substrate, wherein the barrier layer is a tantalum nitride layer, a titanium nitride layer, or combinations thereof and is deposited by a physical vapor deposition process or a chemical vapor deposition process;
   exposing the substrate to dicobalt hexacarbonyl butylacetylene (CCTBA) and hydrogen to form a cobalt layer on the barrier layer during a thermal chemical vapor deposition process, wherein the cobalt layer is metallic cobalt, cobalt boride, cobalt phosphide, or combinations thereof; and
   depositing a conductive material over the cobalt layer, wherein the conductive material comprises copper or a copper alloy.

2. The method of claim 1, further comprising exposing the barrier layer or the cobalt layer to a plasma during a treatment process, wherein the plasma is formed from nitrogen ($N_2$), ammonia ($NH_3$), hydrogen ($H_2$), or combinations thereof.

3. The method of claim 2, wherein the barrier layer or the cobalt layer is exposed to a hydrogen plasma for a time period within a range from about 20 seconds to about 40 seconds and the hydrogen plasma is formed by a remote plasma source.

4. The method of claim 1, further comprising exposing the barrier layer or the cobalt layer to a gas during a thermal treatment process, wherein the gas is nitrogen ($N_2$), ammonia ($NH_3$), hydrogen ($H_2$), or combinations thereof.

5. The method of claim 4, wherein the substrate is heated to a temperature within a range from about 50 degrees Celsius to about 400 degrees Celsius during the thermal treatment process.

6. The method of claim 1, wherein the substrate is heated to a temperature within a range from about 100 degrees Celsius to about 250 degrees Celsius during the thermal chemical vapor deposition process.

7. The method of claim 1, wherein the barrier layer is a tantalum nitride layer disposed on a tantalum layer.

8. The method of claim 1, wherein the conductive material comprises copper or a copper alloy.

9. The method of claim 8, wherein the conductive material comprises a seed layer and a bulk layer.

10. The method of claim 9, wherein the seed layer comprises copper and is deposited by a physical vapor deposition process or a chemical vapor deposition process.

11. The method of claim 10, wherein the bulk layer comprises copper and is deposited by an electrochemical plating process.

12. The method of claim 1, wherein the conductive material is directly deposited on the cobalt layer by an electrochemical plating process.

13. A method for depositing materials on a substrate surface, comprising:
   forming a barrier layer on a substrate, wherein the barrier layer is a tantalum nitride layer, a titanium nitride layer, or combinations thereof and is deposited by a physical vapor deposition process or a chemical vapor deposition process;
   exposing the substrate to dicobalt hexacarbonyl butylacetylene (CCTBA) and hydrogen to form a cobalt layer on the barrier layer during a thermal chemical vapor deposition process;
   exposing the cobalt layer to a plasma during a post-treatment process; and
   depositing a copper material on the cobalt layer by a vapor deposition process, wherein the cobalt layer is metallic cobalt, cobalt boride, cobalt phosphide, or combinations thereof.

14. The method of claim 13, wherein the plasma is formed from nitrogen ($N_2$), ammonia ($NH_3$), hydrogen ($H_2$), argon, helium, or combinations thereof.

15. The method of claim 14, wherein the cobalt layer is exposed to the plasma for a time period within a range from about 20 seconds to about 40 seconds, and the plasma is formed by a remote plasma source.

16. The method of claim 13, wherein the substrate is heated to a temperature within a range from about 100 degrees Celsius to about 250 degrees Celsius during the thermal chemical vapor deposition process.

17. The method of claim 13, wherein the barrier layer is a tantalum nitride layer disposed on a tantalum layer.

18. The method of claim 13, wherein the copper material comprises a seed layer and a bulk layer.

19. The method of claim 18, wherein the seed layer is deposited by a physical vapor deposition process or a chemical vapor deposition process and the bulk layer is deposited by an electrochemical plating process.

20. A method for depositing materials on a substrate surface, comprising:
   forming a barrier layer on a substrate, wherein the barrier layer is a tantalum nitride layer, a titanium nitride layer, or combinations thereof and is deposited by a physical vapor deposition process or a chemical vapor deposition process;
   exposing the substrate to dicobalt hexacarbonyl butylacetylene (CCTBA) and a reducing gas to form a cobalt layer on the barrier layer during a vapor deposition process;
   exposing the cobalt layer to a hydrogen plasma during a post-treatment process; and
   depositing a copper material over the cobalt layer, wherein the cobalt layer is metallic cobalt, cobalt boride, cobalt phosphide, or combinations thereof.

* * * * *